US012813327B2

(12) United States Patent
Kamo

(10) Patent No.: US 12,813,327 B2
(45) Date of Patent: Nov. 24, 2026

(54) STRESS RELIEF STRUCTURE, ELECTRONIC COMPONENT AND METHOD OF MANUFACTURING STRESS RELIEF STRUCTURE

(71) Applicant: Mitsubishi Electric Corporation, Tokyo (JP)

(72) Inventor: Yoshiyuki Kamo, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 319 days.

(21) Appl. No.: 18/576,116

(22) PCT Filed: Aug. 19, 2021

(86) PCT No.: PCT/JP2021/030314
§ 371 (c)(1),
(2) Date: Jan. 3, 2024

(87) PCT Pub. No.: WO2023/021643
PCT Pub. Date: Feb. 23, 2023

(65) Prior Publication Data

US 2024/0243023 A1 Jul. 18, 2024

(51) Int. Cl.
*H10W 74/47* (2026.01)
*H10W 76/60* (2026.01)

(52) U.S. Cl.
CPC .......... *H10W 74/47* (2026.01); *H10W 76/60* (2026.01)

(58) Field of Classification Search
CPC ... H10W 74/47; H10W 76/60; H10W 42/121; H10W 70/60; H10W 74/10; H10W 74/40; H10W 76/10; H05K 3/28
See application file for complete search history.

(56) References Cited

U.S. PATENT DOCUMENTS

| | | | |
|---|---|---|---|
| 6,247,986 | B1 | 6/2001 | Chiu et al. |
| 2020/0006615 | A1 | 1/2020 | Nakaya |
| 2020/0232368 | A1 | 7/2020 | Yamamoto et al. |

FOREIGN PATENT DOCUMENTS

| | | | |
|---|---|---|---|
| JP | 2001085802 | A * | 3/2001 |
| JP | 2002-533898 | A | 10/2002 |

(Continued)

OTHER PUBLICATIONS

International Search Report and Written Opinion mailed on Nov. 16, 2021, received for PCT Application PCT/JP2021/030314, filed on Aug. 19, 2021, 9 pages including English Translation.

(Continued)

*Primary Examiner* — Jonathan Han
(74) *Attorney, Agent, or Firm* — XSENSUS LLP

(57) ABSTRACT

An object of the present disclosure is to enhance thermal stress resistance of an electronic substrate on which electronic components are mounted. A stress relief structure according to the present disclosure includes an electronic substrate, a metal pattern formed on an upper surface of the electronic substrate, an electronic component formed on an upper surface of the metal pattern, a porous layer provided at least any of covers of the metal pattern, corners of the resist when the resist covers the corners of the metal pattern, in a front layer of the electronic substrate in an outer peripheral portion, and on the upper surface of the electronic substrate in the outer peripheral portion, and a sealing resin sealing the upper surface of the electronic substrate, the metal pattern, and the electronic component.

20 Claims, 11 Drawing Sheets

(56) References Cited

FOREIGN PATENT DOCUMENTS

| | | | | |
|---|---|---|---|---|
| JP | 2008-241641 | A | | 10/2008 |
| JP | 2008-277954 | A | | 11/2008 |
| JP | 2015-015434 | A | | 1/2015 |
| JP | 2016152386 | A | * | 8/2016 |
| JP | 2020-114786 | A | | 7/2020 |
| JP | 2021-077781 | A | | 5/2021 |
| WO | 00/39829 | A1 | | 7/2000 |
| WO | 2018/159696 | A1 | | 9/2018 |

OTHER PUBLICATIONS

Notice of Reasons for Refusal mailed on Jan. 25, 2022, received for JP Application 2021-576940, 6 pages including English Translation.

* cited by examiner

STRESS RELIEF STRUCTURE, ELECTRONIC COMPONENT AND METHOD OF MANUFACTURING STRESS RELIEF STRUCTURE

CROSS-REFERENCE TO RELATED APPLICATION

This application is based on PCT filing PCT/JP2021/030314, filed Aug. 19, 2021, the entire contents of which are incorporated herein by reference.

TECHNICAL FIELD

The present disclosure relates to a technique for enhancing thermal stress resistance of an electronic substrate on which electronic components are mounted.

BACKGROUND ART

Stress is concentrated at the end portions or corners of a structure. There is a problem in that, when an adhesive is applied or a resin is injected in areas where such stress is concentrated, the adhesive or resin may peel off or cracks may occur in the adhesive or resin from an end portion of the structure, due to a thermal expansion coefficient difference caused by the temperature cycle or volume changes due to moisture absorption and desorption. Further, as a sealing method for structures with hollow cavities, there are cases where a box-shaped component is used as a cap and adhered in place. In this case too, there is a problem in that the cap may peel off due to thermal stress, or the cap may come off because the moisture inside expands due to the hollow structure and turns into steam when heated. Further, electronic components or mounting substrates may be fixed with screws, caulking, rivets, or the like when installed on a product. At this point, there is a problem in that stress is generated at the end portions, causing cracks in the mounting substrate, and stress is applied to the inside of the electronic component, impairing reliability.

To address these issues, Patent Document 1 describes the rounding off of corners in the coating material on the substrate to enhance the adhesion of the scaling resin. This suppresses peeling of the sealing resin due to thermal stress caused during temperature cycles or customer installation.

PRIOR ART DOCUMENTS

Patent Document(s)

[Patent Document 1] Japanese Patent Application Laid-Open No. 2015-15434

[Patent Document 2] Japanese Patent Application Laid-Open No. 2008-241641

SUMMARY

Problem to be Solved by the Invention

The configuration of Patent Document 1 is expected to enhance adhesion when there is a sealing resin by designing the shape of the coating material, but it cannot be applied when them is no sealing resin. Another problem therein is that not much effect is seen when high thermal stress is applied.

The present disclosure has been made to solve the above problems and the object thereof is to enhance thermal stress resistance of an electronic substrate on which electronic components are mounted.

Means to Solve the Problem

One stress relief structure according to the present disclosure includes an electronic substrate, a metal pattern formed on an upper surface of the electronic substrate, an electronic component formed on an upper surface of the metal pattern, a porous layer provided at least any of corners of the metal pattern, corners of the resist when the resist covers the corners of the metal pattern, in a front layer of the electronic substrate in an outer peripheral portion, and on the upper surface of the electronic substrate in the outer peripheral portion and a sealing resin sealing the upper surface of the electronic substrate, the metal pattern, and the electronic component.

Effects of the Invention

According to one stress relief structure of the present disclosure, the porous layer enhances the adhesion between the sealing resin and the electronic substrate and the like, so that the thermal stress resistance of the electronic substrate on which the electronic component is mounted can be enhanced. The objects, features, aspects, and advantages of the present disclosure will become more apparent from the following detailed description and the accompanying drawings.

DESCRIPTION OF EMBODIMENT(S)

A. Embodiment 1

A—1. Overall Configuration

Figure 1:
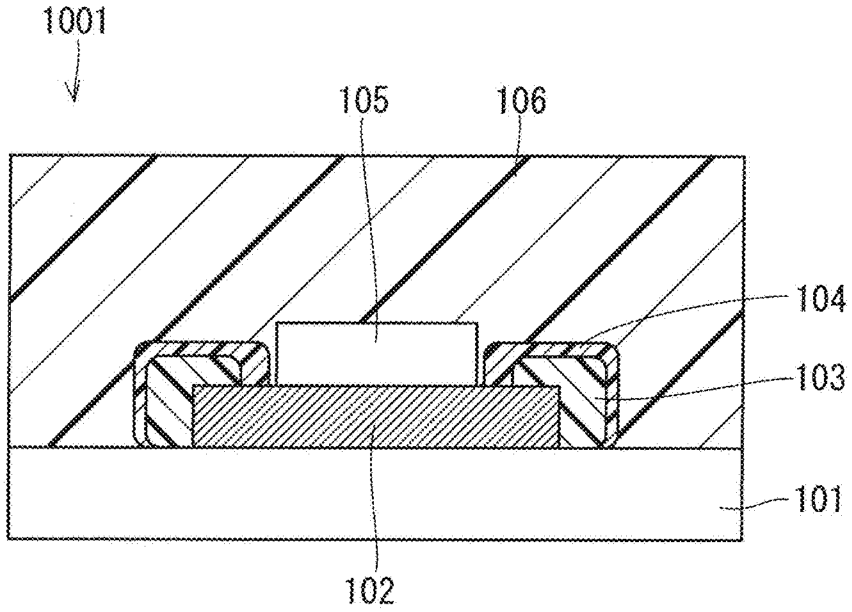
FIG. 1 A cross-sectional view of a stress relief structure according to Embodiment 1.

FIG. 1 is a cross-sectional view of a stress relief structure 1001 according to Embodiment 1. The stress relief structure 1001 includes an electronic substrate 101, a metal pattern

102, a resist 103, a porous layer 104, an electronic component 105, and a sealing resin 106.

A circuit is constructed by drawing a pattern with metal on the electronic substrate 101. Further, a metal pad for mounting the electronic component 105 is provided on the electronic substrate 101. In the present specification, the pattern and the metal pad are collectively referred to as the metal pattern 102.

The corner portions of the metal pattern 102 are covered with the resist 103. The resist 103 is for protecting the metal pattern 102 from solder or other foreign matters during the mounting process of the electronic component 105.

The electronic component 105 is mounted on the metal pattern 102. The electronic component 105 represents, for example, a semiconductor element, a resistor, or a capacitor.

The more elaborately the metal pattern 102 and the resist 103 are made, the smaller the radii of the corner portions become. This results in stress being concentrated at the corner portions of the metal pattern 102 or the resist 103 when the electronic component 105 is sealed with the sealing resin 106.

Therefore, in the stress relief structure 1001, the corner portions of the resist 103, where stress is concentrated, are covered with the porous layer 104 to relieve the stress and to improve the adhesion of the sealing resin 106.

A—2. Porous Layer

The porous layer 104 is made of an organic resin having a porous structure. The porous structure of the porous layer 104 includes a monolith structure, a mesoporous structure, a honeycomb structure, or a layered structure. With the porous structure, a stress relief effect can be obtained.

Also, as the sealing resin 106 permeates into the pores of the porous layer 104, the adhesion area of the sealing resin 106 increases, and the sealing resin 106 comes into three-dimensional contact with the porous layer 104, thereby obtaining an anchor effect, which enhances the adhesion between the porous layer 104 and the sealing resin 106.

Further, by selecting a material with good adhesion to the sealing resin 106 as the material for the porous layer 104, the adhesion between the porous layer 104 and the sealing resin 106 is enhanced.

As a result, high adhesion of the sealing resin 106 can be obtained when the electronic component 105 is mounted on the metal pattern 102 and sealed with the sealing resin 106. In addition, the reliability of electrical devices including the stress relief structure 1001 is improved.

For the organic resin material used for the porous layer 104, by using the one with a lower Young's modulus than that of the sealing resin 106, thereby obtaining a better stress relief effect.

As the organic resin material used for the porous layer 104, there are epoxy compounds (epoxy resin) and acrylic compounds (acrylic resin).

The epoxy resin used for the porous layer 104 includes a bisphenol A epoxy resin, a bisphenol F type epoxy resin, a cresol novolac type epoxy resin, a diphenylmethane type epoxy resin, and an epoxy resin containing multiple aromatic rings. One type from the epoxy resins listed here may be used alone, or two or more types may be used in combination.

Examples of the curing agent used for the porous layer 104 include aromatic amines, aromatic acid anhydrides, aliphatic amines, and modified products thereof. One type from the curing agents listed here may be used alone, or two or more types may be used in combination.

The forming method of the porous layer 104 is as follows. First, a mixture containing the organic resin material, the curing agent, and a pore-forming material is formed at an arbitrary location on the electronic substrate 101 using a coating method such as a printing method or a dipping method. Then, the mixture is thermally cured to form a porous layer with a plurality of pores. Next, the pore-forming material is removed by washing with water or an organic solvent. This is how the porous layer 104 is formed. Although heat curing is described above, other known curing methods such as UV curing may be adopted.

The forming process of the porous layer 104 described above can be performed with general electronic substrate manufacturing equipment, so the advantage there of is that the process can be implemented without major changes in the existing production lines.

When an acrylic resin is used for the porous layer 104, first, a solvent in which one or a plurality of types of PMMA represented by methyl methacrylate, butyl methacrylate, or polymethyl methacrylate are dissolved in a mixed solvent of water and an organic solvent is coated onto the electronic substrate 101. As a coating method, a spray method, a bar coating method, or the like may be used as well as the above-mentioned printing method or dipping method. Similar to epoxy resin, a monolithic structure can be obtained by drying and washing after coating. The pore diameter of acrylic resin can be controlled by changing its molecular weight. The case where the porous layer 104 can be formed using general electronic substrate manufacturing equipment applies to both epoxy resin and acrylic resin.

Further, as a surface treatment to improve adhesion with the sealing resin 106, the electronic substrate 101 may be subjected to physical treatment such as air and argon plasma treatment, deep ultraviolet light treatment, and corona discharge treatment.

A similar effect can be obtained by coating a silane coupling agent onto the electronic substrate 101 as a chemical treatment. For example, 2-(3,4-Epoxycyclohexyl)ethyltrimethoxysilane, 3-Glycidoxypropylmethyldiethoxysilane, 3-Glycidoxypropyltrimethoxysilane, 3-Glycidoxypropylmethyldiethoxysilane, N-(2-Aminoethyl)-3-aminopropylmethyldimethoxysilane, 3-Aminopropyltrimethoxysilane, 3-Triethoxysilyl-N-(1,3-dimethyl-butylidene)propylamine, N-Phenyl-3-aminopropyltrimethoxysilane, N-(Vinylbenzyl)-2-aminoethyl-3-aminopropyltrimethoxysilane hydrochloride, or the like may be used as a primer with epoxy resin.

B. Embodiment 2

Figure 2:
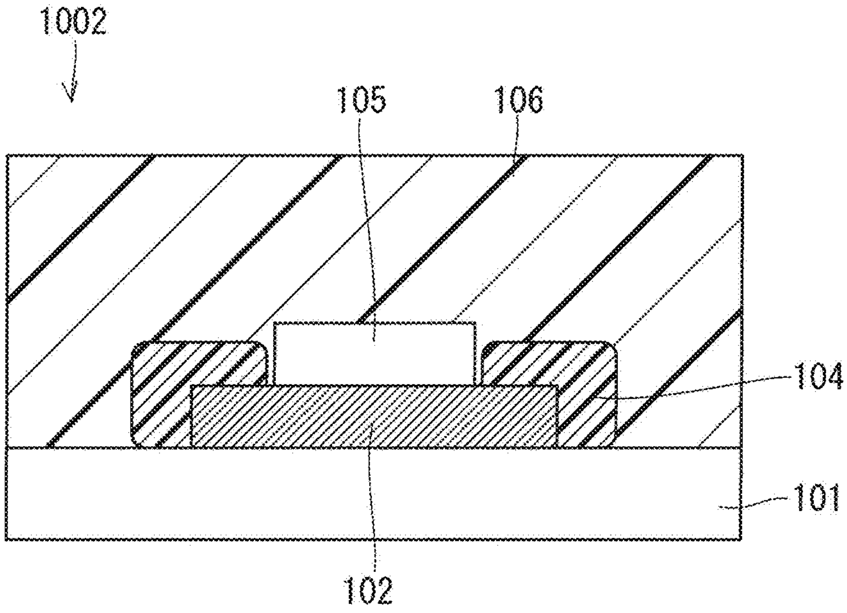
FIG. 2 A cross-sectional view of a stress relief structure according to Embodiment 2.

FIG. 2 is a cross-sectional view of a stress relief structure 1002 according to Embodiment 2. The stress relief structure 1002 includes an electronic substrate 101, a metal pattern 102, a porous layer 104, an electronic component 105, and a sealing resin 106.

Unlike the stress relief structure 1001, the stress relief structure 1002 assumes a case where no resist 103 covering the corner portions of the metal pattern 102 exists. In this case, stress concentrates at the corner portions of the metal pattern 102 when the electronic component 105 is sealed with the sealing resin 106. Therefore, in the stress relief structure 1002, the porous layer 104 covers the corner portions of the metal pattern 102.

In the stress relief structure 1002, the porous layer 104 is provided so as to cover the corner portions of the metal pattern 102, which enhances the adhesion between the sealing resin 106 and the metal pattern 102, suppressing peeling of the sealing resin 106 from the metal pattern 102. The stress relief structure 1002 is particularly effective when the metal pattern 102 is plated with gold or other plating that has poor adhesion to the sealing resin 106.

C. Embodiment 3

Figure 3:
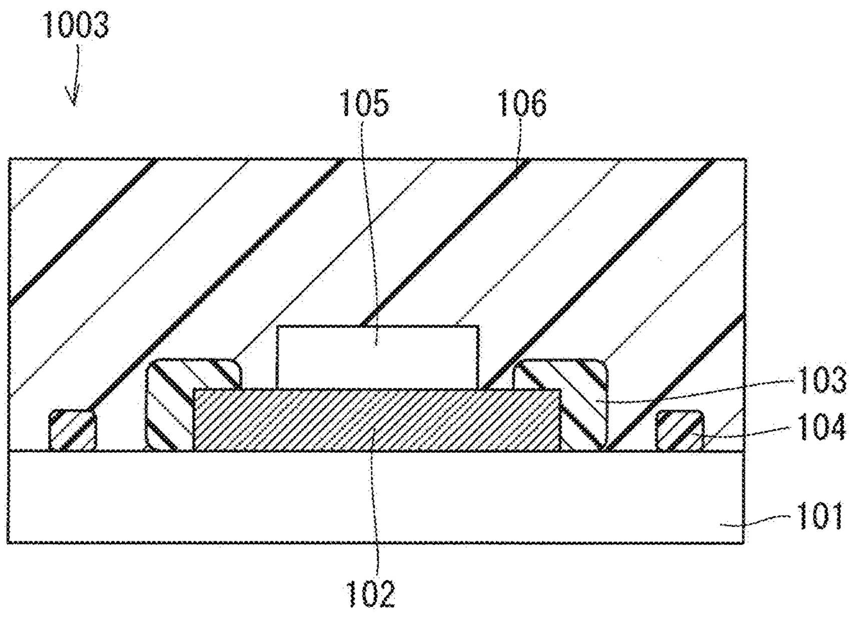
FIG. 3 A cross-sectional view of a stress relief structure according to Embodiment 3.

FIG. 3 is a cross-sectional view of a stress relief structure 1003 according to Embodiment 3. The stress relief structure 1003 differs from the stress relief structure 1001 of Embodiment 1 only in the location where the porous layer 104 is formed.

In the stress relief structure 1003, the porous layer 104 is provided on the upper surface of the electronic substrate 101 in the outer peripheral portion. In the present specification, the outer peripheral portion of the electronic substrate 101 refers to the part between the edge of the electronic substrate 101 and the metal pattern 102.

In the electronic substrate 101, thermal stress increases from the center toward the end portions, so the amount of deformation of the electronic substrate 101 due to thermal stress is greatest at the end portions. Therefore, as illustrated in FIG. 3, by providing the porous layer 104 on the upper surface of the electronic substrate 101 in the outer peripheral portion, the adhesion between the electronic substrate 101 and the sealing resin 106 is enhanced, and the reliability of electrical devices including the stress relief structure 1003 is improved.

Figure 4:
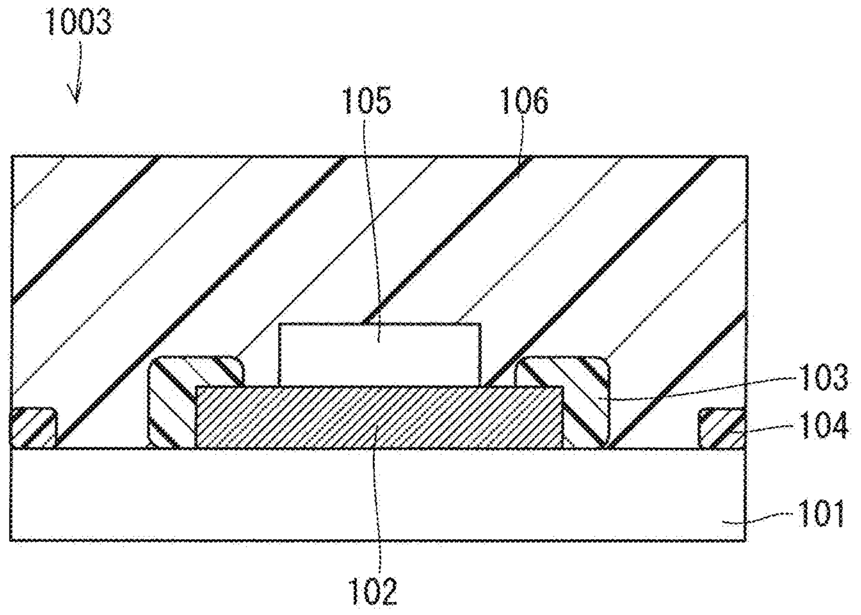
FIG. 4 A cross-sectional view of the stress relief structure according to Embodiment 3.

In FIG. 3, the porous layer 104 is provided more inside than the end portions in the outer peripheral portion of the electronic substrate 101. However, as illustrated in FIG. 4, the porous layer 104 may be provided on the upper surface of the end portions of the electronic substrate 101, and the same effect can be achieved.

D. Embodiment 4

Figure 5:
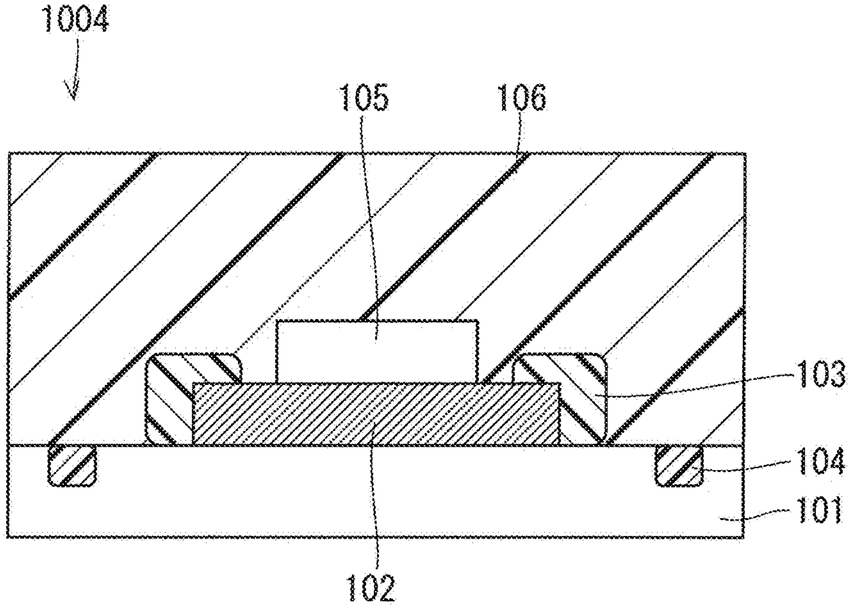
FIG. 5 A cross-sectional view of a stress relief structure according to Embodiment 4.

FIG. 5 is a cross-sectional view of a stress relief structure 1004 according to Embodiment 4. The stress relief structure 1004 differs from the stress relief structure 1003 of Embodiment 3 only in the location where the porous layer 104 is formed. The porous layer 104 is provided on the upper surface of the electronic substrate 101 in the outer peripheral portion in the stress relief structure 1003, whereas the stress relief structure 1004 is provided in a front layer of the electronic substrate 101 in the outer peripheral portion.

In order to mount the electronic component 105 on the metal pattern 102 of the large electronic substrate 101, the electronic component 105 is physically fixed to the electronic substrate 101 by screwing or alignment, or the electronic component 105 is fixed to the electronic substrate 101 by flow or reflow soldering or soldering by an operator using a soldering iron. In the former case, the electronic component 105 is fixed to the end of the electronic substrate 101, which generates stress in the electronic substrate 101 due to mechanical deformation. In the latter case, cracks may occur at an end of the electronic substrate 101 or the sealing resin 106 may peel off from the electronic substrate 101 due to deformation caused by the thermal stress difference within the electronic component 105.

In the stress relief structure 1005, the porous layer 104 is arranged in the front layer of the electronic substrate 101 in the outer peripheral portion, at which the amount of deformation is large, so the electronic substrate 101 itself becomes easy to bend, and the outer peripheral portion and center of the electronic substrate 101 are made possible to change the bending state. Therefore, the influence on the mounting portion of the electronic component 105 or the metal pattern 102 can be reduced even if cracks or peeling of the sealing resin 106 occur in the outer peripheral portion of the electronic substrate 101. By providing the porous layer 104 at at least one location in the front layer of the electronic substrate 101 in the outer peripheral portion, the bending stress of the electronic substrate 101 is alleviated. As a result, the problem of cracks in the electronic substrate 101 or peeling of the sealing resin 106 is solved.

The forming of the porous layer 104 itself is as described in Embodiment 1, but before the process, holes for forming the porous layer 104 are formed in the front layer of the electronic substrate 101. The holes are formed by drilling or laser cutting, or by chemical processing such as etching. The depth of the holes is variable depending on the thickness of the electronic substrate 101, and may extend through the electronic substrate 101.

Figure 6:
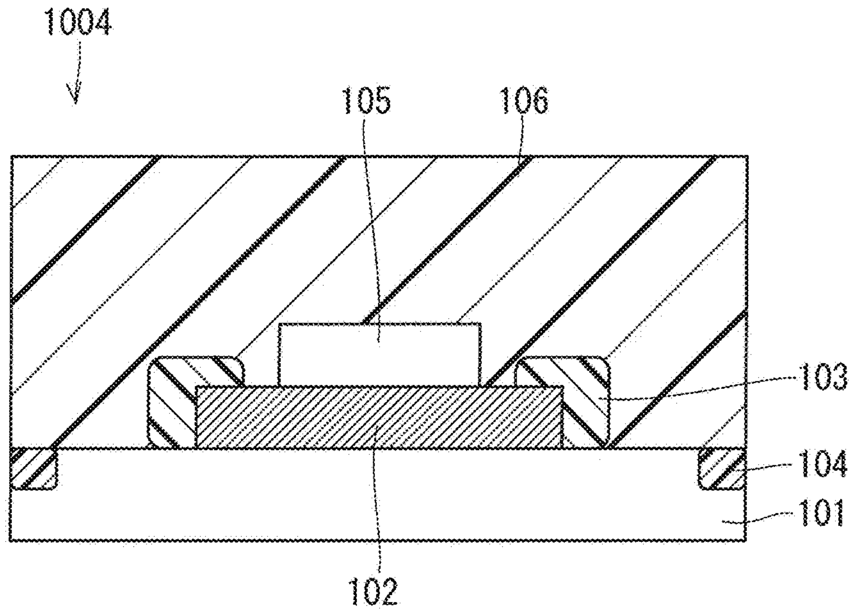
FIG. 6 A cross-sectional view of the stress relief structure according to Embodiment 4.

In FIG. 5, the porous layer 104 is provided in the front layer more inside than the end portions in the outer peripheral portion of the electronic substrate 101. However, as illustrated in FIG. 6, the porous layer 104 may be provided in the front layer of the end portions of the electronic substrate 101, and the same effect can be achieved.

In Embodiments 1-4, various forming locations of the porous layer 104 have been described. The porous layer 104 need only be provided at least any of the locations described above. Specifically, the porous layer 104 is provided at least any of the corners of the metal pattern 102, the corners of the resist 103 when the resist 103 covers the corners of the metal pattern 102, in the front layer of the electronic substrate 101 in the outer peripheral portion, and on the upper surface of the electronic substrate 101 in the outer peripheral portion. In addition to this, the stress relief structures 1001 to 1004 of Embodiments 1 to 4 include the electronic substrate 101, the metal pattern 102 formed on the upper surface of the electronic substrate 101, the electronic component 105 formed on the upper surface of the metal pattern 102, and the sealing resin 106 that seals the upper surface of the electronic substrate 101, the metal pattern 102, and the electronic component 105. Therefore, according to the stress relief structures 1001 to 1004 of Embodiments 1 to 4, the adhesion between the sealing resin 106 and the electronic substrate 101, the metal pattern 102, or the resist 103 can be enhanced.

E. Embodiment 5

Figure 7:
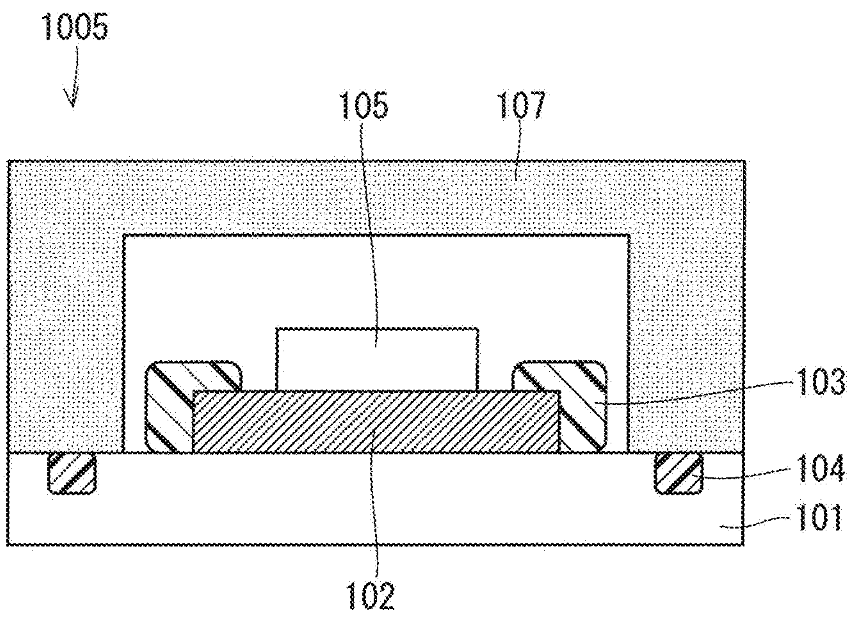
FIG. 7 A cross-sectional view of a stress relief structure according to Embodiment 5.

FIG. 7 is a cross-sectional view of a stress relief structure 1005 according to Embodiment 5. The stress relief structure 1005 includes an electronic substrate 101, a metal pattern 102, a resist 103, a porous layer 104, an electronic component 105, and a cap 107. In the stress relief structure 1005, the porous layer 104 is provided at least in a part of the front layer of the electronic substrate 101 in the outer peripheral portion.

The stress relief structure 1005 differs from the stress relief structure 1004 of Embodiment 4 in that the electronic component 105 is sealed in a hollow state by the cap 107 instead of the sealing resin 106. The cap 107 is made of metal, ceramic, or plastic depending on the use of electronic component 105. The cap 107 has an adhesive surface that is adhered to the upper surface of the electronic substrate 101 in the outer peripheral portion with an adhesive, and an internal space for housing the metal pattern 102, the resist 103, and the electronic components 105 in its adhered state to the electronic substrate 101.

In the stress relief structure 1005, the porous layer 104 is provided in the front layer of the electronic substrate 101 in the outer peripheral portion. Therefore, the stress on the electronic substrate 101 is alleviated. The structure and material of the porous layer 104 are as described in Embodiment 1. For the organic resin material used for the porous layer 104, by using the one with a lower Young's modulus than that of the adhesive that adheres the cap 107 and the electronic substrate 101 together, thereby obtaining a better stress relief effect.

And, the porous layer 104 is provided at a position overlapping the adhesive surface of the cap 107 to the electronic substrate 101 in a state of the cap 107 adhered to the electronic substrate 101. That is, the cap 107 is in contact with the porous layer 104 in a state of being adhered to the electronic substrate 101. Consequently, the adhesive strength between the cap 107 and the electronic substrate 101 is enhanced.

Further, the porous layer 104 secures air passages. The electronic substrate material used for the electronic component 105 absorbs moisture by absorbing moisture from the air in a normal storage environment. In a device with a hollow structure, soldering an electronic component 105 that has absorbed moisture as it is causes evaporation of the moisture in the electronic component 105 into the cap 107 due to the heat of soldering, leading to a possible trouble of the cap 107 coming off due to pressure surge inside the cap 107. However, air passages are secured by the porous layer 104 secures; therefore, the above-mentioned trouble is suppressed.

Figure 8:
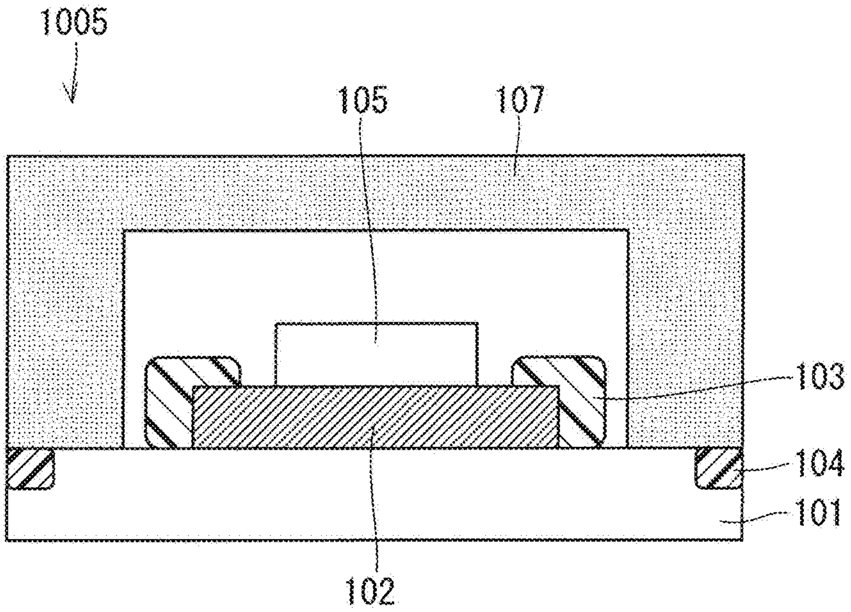
FIG. 8 A cross-sectional view of the stress relief structure according to Embodiment 5.

In FIG. 7, the porous layer 104 is provided in the front layer more inside than the end portions in the outer peripheral portion of the electronic substrate 101. However, as illustrated in FIG. 8, the porous layer 104 may be provided in the front layer of the end portions of the electronic substrate 101, and the same effect can be achieved.

E. Embodiment 6

Figure 9:
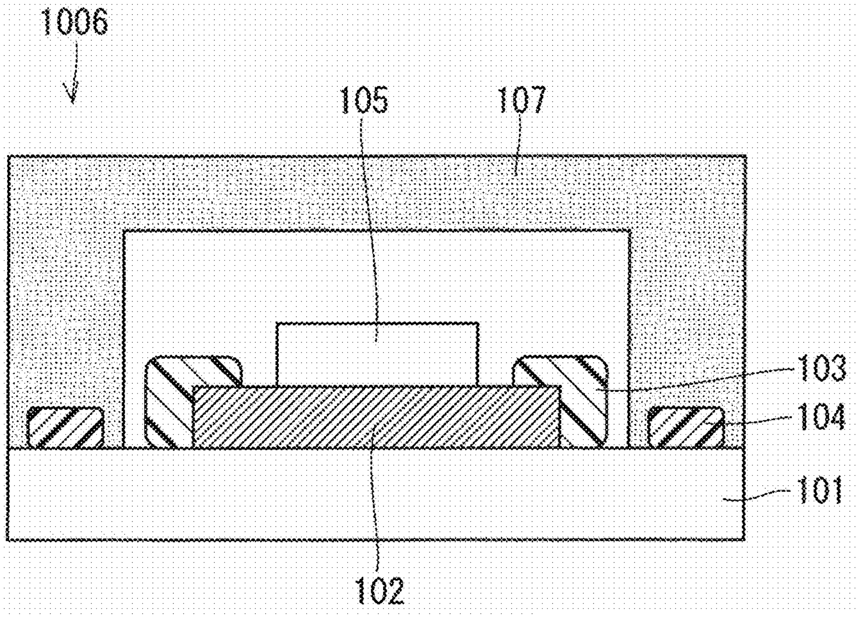
FIG. 9 A cross-sectional view of a stress relief structure according to Embodiment 6.

FIG. 9 is a cross-sectional view of a stress relief structure 1006 according to Embodiment 6. The stress relief structure 1006 differs from the stress relief structure 1005 of Embodiment 5 only in the location where the porous layer 104 is formed. Whereas in the stress relief structure 1005, the porous layer 104 was formed in the front layer of the electronic substrate 101 in the outer peripheral portion, in the stress relief structure 1006, the porous layer 104 is provided on the adhesive surface of the cap 107 to the electronic substrate 101. Specifically, a recess portion is provided in the adhesive surface of the cap 107 to the electronic substrate 101, and the porous layer 104 is formed in this recess portion. The porous layer 104 is in contact with the upper surface of the electronic porous layer 104 of the outer peripheral portion in a state of the cap 107 adhered to the electronic substrate 101.

The forming of the porous layer 104 itself is as described in Embodiment 1, but before the process, the recess portion is formed on the adhesive surface of the cap 107 by die cutting.

The porous layer 104 provided on the cap 107 does not contribute to stress relief, but allows water vapor to escape. Therefore, the trouble of the cap 107 coming off due to pressure surge inside the cap 107 is suppressed. Further, depending on the material, the cap 107 may have poor compatibility with the adhesive, making the cap 107 susceptible to peeling from electronic substrate 101. Even in such a case, the adhesion between the cap 107 and the electronic substrate 101 can be enhanced by selecting a material with fine adhesion for the porous layer 104.

E. Embodiment 7

Figure 10:
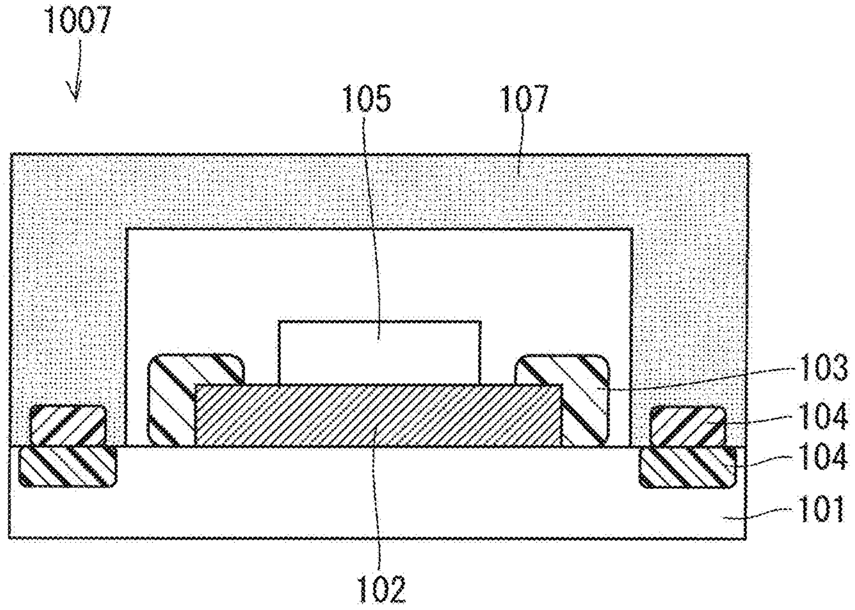
FIG. 10 A cross-sectional view of a stress relief structure according to Embodiment 7.

FIG. 10 is a cross-sectional view of a stress relief structure 1007 according to Embodiment 7. The stress relief structure 1007 has a structure in which the stress relief structure 1005 of Embodiment 5 and the stress relief structure 1006 of Embodiment 6 are combined. Specifically, the stress relief structure 1007 includes the porous layers 104 in both the electronic substrate 101 and in the cap 107, respectively, in the contact area between the electronic substrate 101 and the cap 107. Other than the porous layers 104, the configuration of the stress relief structure 1007 is the same as the stress relief structures 1005 and 1006 of Embodiments 5 and 6.

The porous layer 104 provided in the electronic substrate 101 and the porous layer 104 provided in the cap 107 may or may not have the same materials and structures.

The stress relief structure 1007 includes the porous layers 104 in both the electronic substrate 101 and the cap 107; therefore, the electronic component 105 can be placed in an outside air environment close to outside air in comparison with the stress relief structures 1005 and 1006 of Embodiments 5 and 6, which include the porous layer 104 in only one of the electronic substrate 101 and the cap 107. Appropriate product designing is allowed by selecting the stress relief structures 1005-1007 of Embodiments 5-7 depending on the level of airtightness required for the electronic component 105 or the degree of pressure surge in the cap 107 due to water vapor.

In other words, when considering the stress relief structures 1005-1007 of Embodiments 5-7 as a whole, the stress relief structure includes the electronic substrate 101, the metal pattern 102 formed on the upper surface of the electronic substrate 101, the electronic component 105 formed on the upper surface of the metal pattern 102, the cap 107 having an adhesive surface that is adhered to the upper surface of the electronic substrate 101 with an adhesive, and having an internal space for housing the metal pattern 102 and the electronic component 105, and the porous layer 104 provided in at least one of the front layer of the electronic substrate 101 and the front layer of the cap 107 in a region where the electronic substrate 101 and the cap 107 are adhered. The porous layer 104 is provided in the front layer of the electronic substrate 101 in the outer peripheral portion; therefore, the stress on the electronic substrate 101 is alleviated. Further, the cap 107 contacts the porous layer 104 in its adhered state to the electronic substrate 101; therefore, the adhesive strength between the cap 107 and the electronic substrate 101 is enhanced. Further, the porous layer 104 secures air passages; therefore, the trouble of the cap 107 coming off due to pressure surge inside the cap 107 is suppressed.

E. Embodiment 8

Figure 11:
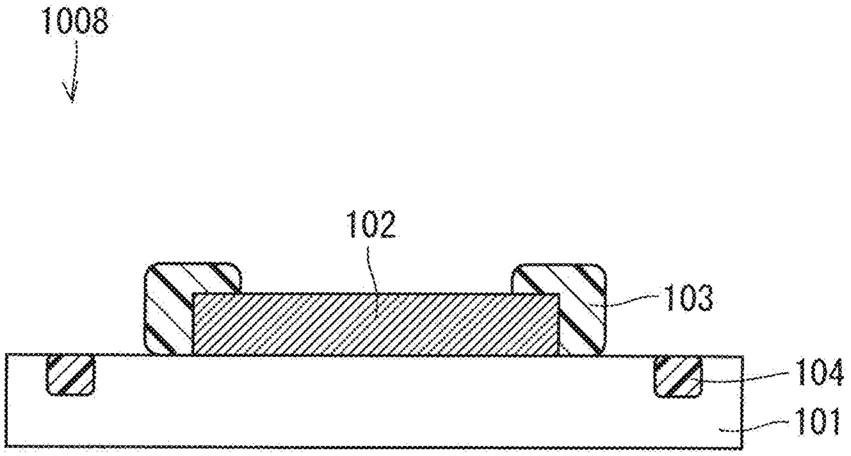
FIG. 11 A cross-sectional view of a stress relief structure according to Embodiment 8.

FIG. 11 is a cross-sectional view of a stress relief structure 1008 according to Embodiment 8. The stress relief structure 1008 includes an electronic substrate 101, a metal pattern 102, a resist 103, and a porous layer 104.

Unlike the stress relief structure 1004 of Embodiment 4, the stress relief structure 1008 does not include the electronic component 105 and the sealing resin 106.

Although the porous layer 104 is formed in the front layer of the electronic substrate 101 in the outer peripheral portion in FIG. 11, the porous layer 104 may be formed on the upper surface of the electronic substrate 101 in the outer peripheral portion.

That is, the stress relief structure 1008 of Embodiments 8 includes the electronic substrate 101, the metal pattern 102 formed on the upper surface of the electronic substrate 101, and the porous layer 104 provided at least one of in the front layer of the electronic substrate 101 in the outer peripheral portion and on the upper surface of the electronic substrate 101 in the outer peripheral portion.

Even if the electronic substrate 101 is not sealed with the sealing resin 106, the provision of the porous layer 104 in the outer peripheral portion of the electronic substrate 101 alleviates warping of the electronic substrate 101 caused by thermal stress when electronic components are mounted on the metal pattern 102. Further, when the outer peripheral portion of the electronic substrate 101 is physically fixed by screwing or caulking, stress on the electronic substrate 101 is alleviated.

In the stress relief structure 1008, the porous layer 104 is arranged in the front layer of the electronic substrate 101 in the outer peripheral portion, at which the amount of deformation is large, so the electronic substrate 101 itself becomes easy to bend, and the outer peripheral portion and center of the electronic substrate 101 are made possible to change the bending state. Therefore, the influence on the mounting portion of the electronic component or the metal pattern 102 can be reduced even if cracks occur in the outer peripheral portion of the electronic substrate 101. By providing the porous layer 104 at at least one location in the front layer of the electronic substrate 101 in the outer peripheral portion, the bending stress of the electronic substrate 101 is alleviated. As a result, cracks in the electronic substrate 101 are suppressed.

The method for forming the porous layer 104 in the front layer of the outer peripheral portion of electronic substrate 101 is as described in Embodiments 1 and 4.

It should be noted that Embodiments can be arbitrarily combined and can be appropriately modified or omitted. While the forgoing description is in all aspects illustrative and not restrictive, it is therefore understood that numerous undescribed modifications and variations can be devised.

EXPLANATION OF REFERENCE SIGNS

101 electronic substrate, 102 metal pattern, 103 resist, 104 porous layer, 105 electronic component, 106 sealing resin, 107 cap, 1001 to 1008 stress relief structure.

The invention claimed is:

1. A stress relief structure comprising:
an electronic substrate;
a metal pattern formed on an upper surface of the electronic substrate;
an electronic component formed on an upper surface of the metal pattern;
a porous layer provided at least at any of:
corners of the metal pattern,
corners of a resist in combination with the resist covering the corners of the metal pattern,
in a front layer of the electronic substrate in an outer peripheral portion, and
on the upper surface of the electronic substrate in the outer peripheral portion; and
a sealing resin sealing the upper surface of the electronic substrate, the metal pattern, and the electronic component, and part thereof permeating into pores of the porous layer, wherein
the porous layer includes a resin material made of an epoxy compound or an acrylic compound.

2. The stress relief structure according to claim 1, wherein the porous layer includes the resin material having a lower Young's modulus than that of the sealing resin.

3. An electronic component comprising:
the stress relief structure according to claim 1.

4. The stress relief structure according to claim 1, wherein:
the porous layer contacts the electronic substrate.

5. The stress relief structure according to claim 4, wherein:
the porous layer directly contacts the electronic substrate.

6. The stress relief structure according to claim 1, wherein:
a lower surface of the porous layer extends in a same plane with the upper surface of the electronic substrate.

7. The stress relief structure according to claim 1, wherein:
an upper surface of the porous layer extends in a same plane with the upper surface of the electronic substrate.

8. The stress relief structure according to claim 1, wherein:
the porous layer is provided in the outer peripheral portion defined between an edge of the electronic substrate and the metal pattern, and the porous layer is positioned at the edge of the electronic substrate.

9. The stress relief structure according to claim 1, wherein:
the porous layer is provided in the outer peripheral portion defined between an edge of the electronic substrate and the metal pattern, and the porous layer is positioned between the edge and the metal pattern.

10. A stress relief structure comprising:
an electronic substrate;
a metal pattern formed on an upper surface of the electronic substrate;
an electronic component formed on an upper surface of the metal pattern;
a cap having an adhesive surface that is adhered to the upper surface of the electronic substrate with an adhesive, and having an internal space for housing the metal pattern and the electronic component;
at least one porous layer; and
the at least one porous layer is provided in at least one of a front layer of the electronic substrate and a front layer of the cap in a region where the electronic substrate and the cap are adhered, wherein
the at least one porous layer includes a resin material having a lower Young's modulus than that of the adhesive.

11. The stress relief structure according to claim 10, wherein
the at least one porous layer includes the resin material made of an epoxy compound or an acrylic compound.

12. An electronic component comprising:
the stress relief structure according to claim 10.

13. The stress relief structure according to claim 10, wherein:
the at least one porous layer contacts the electronic substrate and the cap, or
the at least one porous layer contacts another porous layer and at least one of the electronic substrate and the cap.

14. The stress relief structure according to claim 13, wherein:
the at least one porous layer directly contacts the electronic substrate and the cap, or the at least one porous layer directly contacts another porous layer and at least one of the electronic substrate and the cap.

15. The stress relief structure according to claim 10, wherein:

a lower surface of the at least one porous layer extends in a same plane with the upper surface of the electronic substrate.

16. The stress relief structure according to claim 10, wherein:

an upper surface of the at least one porous layer extends in a same plane with the upper surface of the electronic substrate.

17. The stress relief structure according to claim 10, wherein:

the at least one porous layer is provided in an outer peripheral portion defined between an edge of the electronic substrate and the metal pattern, and the at least one porous layer is positioned at the edge of the electronic substrate.

18. The stress relief structure according to claim 10, wherein:

the at least one porous layer is provided in an outer peripheral portion defined between an edge of the electronic substrate and the metal pattern, and the at least one porous layer is positioned between the edge and the metal pattern.

19. A method of manufacturing a stress relief structure, comprising:

coating a mixture containing a resin material made of an epoxy compound or an acrylic compound, a curing agent, and a pore-forming material on an upper surface of an electronic substrate;

forming a porous layer containing the resin material by removing the pore-forming material by washing after the mixture is thermally cured; and forming a sealing resin on the porous layer and permeating the sealing resin into pores of the porous layer.

20. The method for manufacturing the stress relief structure according to claim 19, further comprising:

forming the porous layer to contact the electronic substrate.

* * * * *